(12) United States Patent
Naumann et al.

(10) Patent No.: US 11,578,862 B2
(45) Date of Patent: *Feb. 14, 2023

(54) EXPLOSION-PROOF HOUSING AND METHOD FOR PRODUCING THE SAME

(71) Applicant: Eaton Intelligent Power Limited, Dublin (IE)

(72) Inventors: Reiner Naumann, Mannheim (DE); Jens Burmeister, Eberbach (DE); Toni Ott, Neckargemünd (DE)

(73) Assignee: EATON INTELLIGENT POWER LIMITED, Dublin (IE)

( * ) Notice: Subject to any disclaimer, the term of this patent is extended or adjusted under 35 U.S.C. 154(b) by 0 days.

This patent is subject to a terminal disclaimer.

(21) Appl. No.: 17/577,990

(22) Filed: Jan. 18, 2022

(65) Prior Publication Data
US 2022/0136688 A1 May 5, 2022

Related U.S. Application Data

(63) Continuation of application No. 16/494,677, filed as application No. PCT/EP2018/056483 on Mar. 15, 2018, now Pat. No. 11,248,782.

(30) Foreign Application Priority Data

Mar. 16, 2017 (DE) ..................... 10 2017 105 683.1

(51) Int. Cl.
*B29C 65/16* (2006.01)
*B29C 65/44* (2006.01)
(Continued)

(52) U.S. Cl.
CPC .............. *F21V 25/12* (2013.01); *B29C 65/16* (2013.01); *B29C 65/44* (2013.01);
(Continued)

(58) Field of Classification Search
None
See application file for complete search history.

(56) References Cited

U.S. PATENT DOCUMENTS

| 10,618,207 | B2 * | 4/2020 | Kose ................. B29C 45/14311 |
| 2010/0202103 | A1 | 8/2010 | Schwarz et al. |
| 2021/0402712 | A1 * | 12/2021 | Lakenbrink ....... B29C 66/30325 |

FOREIGN PATENT DOCUMENTS

| DE | 102012111393 A1 | 5/2014 |
| DE | 102014220911 B3 | 10/2015 |

* cited by examiner

Primary Examiner — Britt D Hanley
(74) Attorney, Agent, or Firm — Stinson LLP

(57) ABSTRACT

An explosion-proof housing includes at least one metal housing part having at least one of a housing opening or receiving surface, and a support edge bordering said at least one of a housing opening or receiving surface. A cover part covers said at least one of a housing opening or the receiving surface. The cover part includes a peripheral cover edge which is connected to the support edge in an explosion-proof manner such that in the event of an explosion inside the housing, the explosion is prevented from crossing over to an explosive atmosphere surrounding the housing. A plurality of connection points are formed between the support edge and the cover edge. The connection points include interlocking depressions and protrusions. The protrusions are formed by partial melting of the cover edge. The depressions and the protrusions interlock with play in a longitudinal direction of the housing.

11 Claims, 3 Drawing Sheets

(51) Int. Cl.
  *B29C 65/00* (2006.01)
  *H05K 5/03* (2006.01)
  *H05K 5/06* (2006.01)
  *B29L 31/00* (2006.01)
  *F21V 25/12* (2006.01)
  *F21V 29/503* (2015.01)
  *F21V 29/70* (2015.01)
  *F21V 15/01* (2006.01)
  *F21V 31/00* (2006.01)
  *F21Y 115/10* (2016.01)

(52) U.S. Cl.
  CPC .. *B29C 66/30325* (2013.01); *B29C 66/73365* (2013.01); *B29C 66/742* (2013.01); *F21V 15/01* (2013.01); *F21V 29/503* (2015.01); *F21V 29/70* (2015.01); *F21V 31/005* (2013.01); *H05K 5/03* (2013.01); *H05K 5/066* (2013.01); *B29L 2031/747* (2013.01); *F21Y 2115/10* (2016.08)

[FIG. 1]
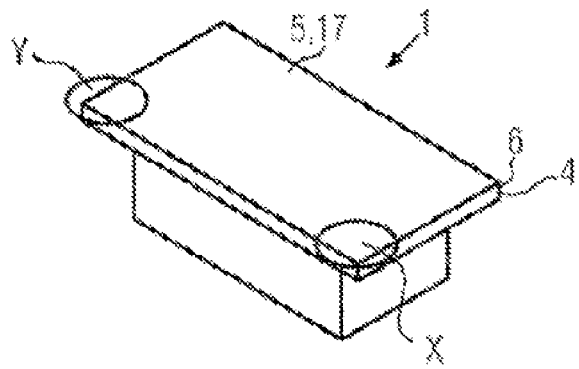
[FIG. 2]
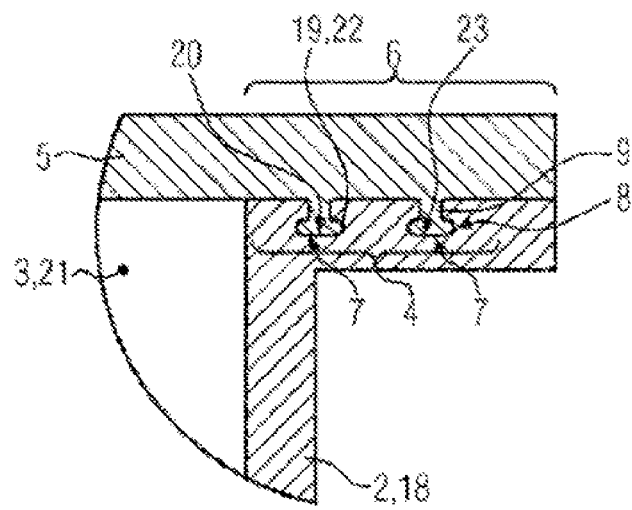
[FIG. 3]
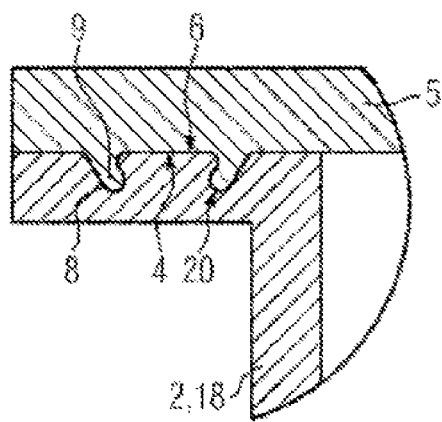

[FIG. 4]
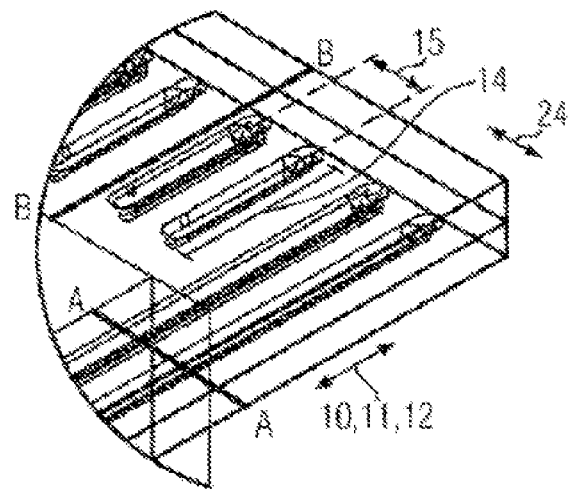
[FIG. 5]
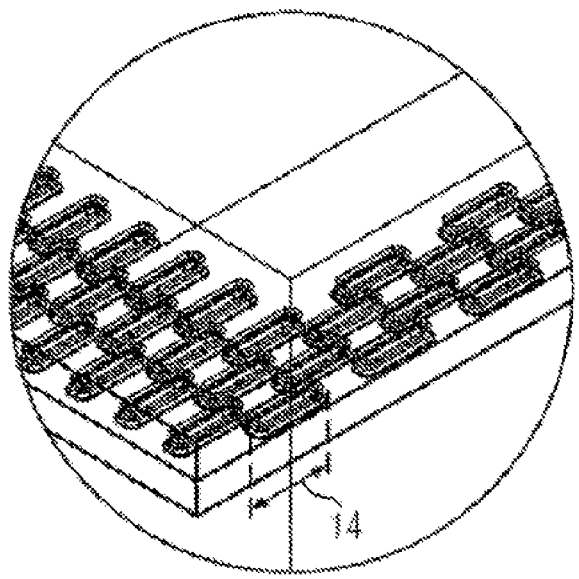

[FIG. 6]
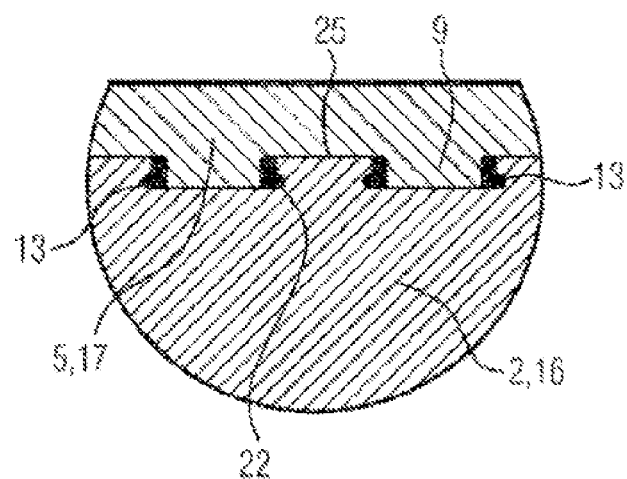

EXPLOSION-PROOF HOUSING AND METHOD FOR PRODUCING THE SAME

CROSS-REFERENCE TO RELATED APPLICATION

The present application is a continuation application of U.S. patent application Ser. No. 16/494,677, which was filed Sep. 17, 2019, which is a US National Stage Application of International Application No. PCT/EP2018/056483, filed Mar. 15, 2018, which claims the benefit of DE10 2017 105 683.1 filed Mar. 16, 2017, all of which are incorporated herein by reference in their entirety for all purposes.

FIELD OF THE DISCLOSURE

The disclosure generally relates to an explosion-proof housing.

SUMMARY OF THE DISCLOSURE

The invention relates to an explosion-proof housing comprising at least one metal housing part with at least one housing opening and/or a receiving surface and a support edge bordering said housing opening and/or receiving surface. Furthermore, the housing comprises a cover part which closes or covers the housing opening and/or the receiving surface, in particular a transparent cover part made of a plastic with a peripheral cover edge. The cover edge and support edge are connected to one another in an explosion-proof manner, wherein in particular an Ex d connection is formed. Even in an explosive atmosphere, such an explosion-proof housing prevents any ignition of this atmosphere by electrical or electronic equipment contained in the housing.

One possibility in this respect is, for example, to connect a housing part to a cover part with corresponding gaps between them, such as a flat gap, a cylindrical gap, or a threaded gap. If a mixture located in the interior of the housing ignites, the corresponding gap length and gap width will prevent the ignition of a likewise potentially explosive atmosphere which is located outside the housing.

There are other types of ignition protection that can prevent such ignition of the external atmosphere, such as powder filling, encapsulation, oil immersion, and the like.

In particular, the present invention relates to a pressure-resistant enclosure in which an explosive atmosphere penetrates into the respective housing of the electrical equipment, but in the event of an explosion inside the housing, the explosion is prevented from crossing over to the explosive atmosphere surrounding the housing. Used for this purpose as a rule are the aforementioned gaps, which are designed in such a way that an ignition through these gaps is reliably prevented. A corresponding gap geometry as well as gap lengths and gap widths are designed differently, depending on the equipment protection level.

It is likewise known from practice, in particular in the case of a metal housing part and a cover part made of plastic, to glue these together along the corresponding edges.

The invention is based on the aim of improving a housing of the aforementioned type in such a way that a corresponding connection of housing part and cover part to form an explosion-proof housing can be brought about in a simple and reliable manner without the use of adhesive. At the same time, such a housing should have a high connection stability between the housing part and the cover part, wherein it should be possible to produce the connection quickly and at low cost.

According to the invention, a plurality of connection points is produced between the support edge and the cover edge and designed as interlocking depressions and protrusions, the protrusions being formed by partial melting of the cover edge. This creates a number of positively connected connection points between the housing part and the cover part or their edges, which can be produced in a corresponding number and shape as required. The stability of the connection depends not only on the two materials, on the shape and number of connection points but also on their arrangement relative to each other.

Such an explosion-proof housing accommodates electrical equipment, the electrical equipment and in particular indicator lights or the like being visible through the transparent cover part. These indicator lights may indicate a status of the electrical equipment. In this case, it is furthermore possible to open the metal housing part in order to carry out maintenance of the electrical equipment or the like.

However, the present invention relates to the connection between the metal housing part and the cover part.

With regard to the depressions in the support edge, it is possible to create them during the production of the housing part by appropriate machining. However, it is also possible according to the invention for the depressions in the support edge of the housing part to be produced in a corresponding number and shape, for example by means of a laser or the like. The cover part made of plastic can then be fitted directly by placing the cover edge on the support edge. For example, the laser can then also be used for heating the support edge, wherein as a result of this heating, the cover edge at least partially melts and material of the cover edge penetrates into the depressions while forming the protrusions. The partially melted cover edge then cures so as to create the adhesive-free connection of the depressions and the correspondingly formed protrusions. The interlocking of depressions and protrusions results overall in the connection between the metal housing part and the cover part.

The result is a closed housing which is made of two different components and meets the requirements for explosion protection. The housing consists of the metal housing part and the transparent cover part, which are connected in a simple, fast and cost-effective manner without using an adhesive.

There is of course the possibility of selecting the number and shape of the depressions as well as their distance from one another, their orientation relative to the support edge, and so on during production. The corresponding protrusions are formed automatically by the corresponding partial melting of the cover part and, in this way, the result is a plurality of small connection points which, while providing high connection stability, meet all requirements for explosion protection.

Furthermore, it is advantageous that the connection stability in no way depends on the adhesive used or on its effect, this normally being a limiting factor for the stability of the connection and the service life of the connection. This applies in particular to temperature changes and different expansions of the various materials of the housing.

In a simple exemplary embodiment, it may prove sufficient for the corresponding protrusions and depressions to extend substantially only in one direction along the edges. It is likewise conceivable for the depressions and protrusions to extend in the direction of the respective peripheral edge and optionally also to be curved. According to the present invention, all these various possibilities can be realized and also combined depending on the requirements.

In a simple exemplary embodiment, it may prove advantageous if all depressions and protrusions extend along only one longitudinal direction, wherein this direction can run in particular along a wall longitudinal direction or edge longitudinal direction of the housing part.

The depressions can, for example, simply extend downward into the material and orthogonally to the surface of the corresponding support edge. It is likewise conceivable for the depressions to run obliquely into the material and orthogonally to the longitudinal direction. This applies analogously to the protrusions which are produced by melting the cover edge and are formed by material of the cover part penetrating into the depressions.

Other profiles of the depressions and thus of the protrusions are conceivable, such as depressions and protrusions which have grooves or groove protrusions running essentially orthogonally to the longitudinal direction. In other words, the depressions extend into the material of the support edge but within it have grooves still running orthogonally to the longitudinal direction. The protrusions are formed correspondingly.

In this connection, it can furthermore be considered advantageous if grooves and groove protrusions are formed orthogonally to the longitudinal direction on both sides. This results in a closer and more stable connection of the corresponding parts.

In the present application, it can furthermore be considered advantageous if, for example, a corresponding number of depressions and protrusions are respectively formed in the edges at a distance from each other in the longitudinal direction and orthogonally to the longitudinal direction. The corresponding depressions thus do not need to extend over the entire length of the support edge, but a number of such depressions can be formed longitudinally one after the other and at a distance from each other. This then applies analogously to the protrusions in the cover edge. The spacing can also be implemented in a direction orthogonal to the longitudinal direction, wherein in each case as many depressions and protrusions as are considered necessary for a secure connection between the housing part and the cover part are formed in this direction.

It is conceivable, for example, for the support edge or cover edge to be formed in each case from two components, such as metal and plastic. In this case, it is possible for the depressions to be formed in each case in the metal part and for the protrusions to be formed in the plastic part. In a simple exemplary embodiment, however, the corresponding parts are each produced from only one component, at least in the region of their edges, so that the depressions are formed in the support edge and the protrusions are formed in the cover edge.

In order to be able to compensate for possibly different temperature expansions of these materials, depressions and protrusions can interlock with play in the longitudinal direction.

In a simple exemplary embodiment, depressions and protrusions of the same length can be arranged in the longitudinal direction with the same spacing. It is also conceivable for depressions and protrusions to all have the same shape. In this case, the shape of the protrusions essentially results from the shape of the depressions; see the method according to the invention.

The invention can also be used when, for example, the housing part is a heat sink and the cover part is a plastic cover for a light-emitting diode (LED). In this case, a corresponding plastic cover can also be provided for a plurality of LEDs. The LED is arranged on the heat sink and its receiving surface or, in the case of a plurality of LEDs, arranged there at a distance from each other, this receiving surface being surrounded by the support edge. In the region of this support edge, the corresponding plastic cover for one or more LEDs then rests with the corresponding cover edge on the support edge and is fastened there in the manner already described.

According to the invention, the aforementioned grooves or groove protrusions result, for example, from being created by an undercut in the region of the depression bottom during the step of creating the corresponding depression. Depending on its arrangement, this undercut then forms one or even two grooves. The corresponding groove protrusion results when the cover edge is melted to produce the protrusion, which then additionally has the corresponding groove protrusions.

This likewise applies in the creation of depressions running obliquely to the longitudinal direction, which are likewise created in a corresponding manner directly by the laser or by another processing method during the creation of the depressions in the support edge.

BRIEF DESCRIPTION OF THE DRAWINGS

In the following, advantageous exemplary embodiments of the invention are explained in more detail with reference to the figures appended in the drawing. Shown are:

FIG. 1 is a perspective plan view of an explosion-proof housing according to the invention consisting of housing part and cover part;

FIG. 2 is a section along a line A-A of FIG. 4 in a first exemplary embodiment;

FIG. 3 is a section analogous to FIG. 2 through a second exemplary embodiment;

FIG. 4 is a view of a region X of FIG. 1 in an enlarged representation;

FIG. 5 is a view of a region Y of FIG. 1 in an enlarged representation for a further exemplary embodiment; and FIG. 6 is a section analogous to FIGS. 2 and 3 along a line B-B orthogonal to line A-A.

DETAILED DESCRIPTION OF THE DISCLOSURE

FIG. 1 shows an explosion-proof housing 1 according to the invention, consisting of a housing part 2 and a cover part 5. Such a housing part 2 can also be a heat sink 16 on which, for example, one or more LEDs are arranged, which are covered by a plastic cover 17 instead of a flat cover part 5. In each case, the explosion-proof housing or housing part 2 or cover part 5 has a corresponding support edge 4 or cover edge 6; see also FIGS. 2 and 3. The latter are in contact with each other and are connected by a plurality of connection points 7. The housing part 2 is made of metal and the cover part 5 is made of a transparent plastic. As a result, electrical equipment, such as a signal lamp or the like, within the housing part 2 is visible or, in the case of heat sink 16 and plastic cover 17, the corresponding LEDs are visible.

FIGS. 2 and 3 show longitudinal sections along line A-A of FIG. 4 for two different exemplary embodiments of connection points 7.

In FIG. 2, depressions 8 extend along a direction 10 (see FIG. 4) which corresponds in the exemplary embodiment shown to a longitudinal direction 11 or to a direction parallel to the wall longitudinal direction 12 of a corresponding housing wall 18.

It is also possible for the depressions 8 to not only extend in one direction but to extend in different directions depending on their arrangement in the support edge 4 or to be curved or angled in the region of corners of the support edge 4. However, creation of depressions 8 which all run in the same longitudinal direction 11 and essentially in parallel to the wall longitudinal direction 12 is a simple exemplary embodiment which is distinguished by a simple arrangement of the corresponding depressions.

In FIG. 2, the depressions (see also FIG. 3) have an undercut 19 in the form of grooves 22 in the region of a depression bottom 20. These grooves extend on both sides of the longitudinal direction 11 in a corresponding transverse direction 24 (see also FIG. 4). In the longitudinal direction 11, the grooves 22 are filled by corresponding groove protrusions 23 of the protrusions 9, while corresponding grooves (see FIG. 6) at ends of the depressions 8 are unfilled in the longitudinal direction 11 in order to provide a play 13 between depressions 8 and protrusions 9. Possible different expansions of housing part 2 and cover part 5 at varying temperatures due to the different materials can thereby be compensated.

In the exemplary embodiment according to FIG. 2, two depressions 8 in the corresponding support edge 4 are arranged next to each other in the transverse direction 24 (see also FIG. 4). There is of course the possibility of also creating fewer or more such depressions with different spacings, depths and shapes. In a simple exemplary embodiment, the depressions 8 are all of the same shape and, depending on their arrangement on the support edge, are also of the same length 14 (see FIGS. 4 and 5).

In FIG. 2, the housing part 2 has a housing opening 3 which is closed off upwardly by the cover part 5. Instead of the housing opening 3, a receiving surface 21 can be formed, which serves, for example, for arranging one or more LEDs on a corresponding heat sink 16 as housing part 2.

FIG. 3 shows another exemplary embodiment of the depressions 8 in which the corresponding protrusions 9 engage. In this case, the depressions 8 run in the transverse direction 24, i.e., orthogonally to the longitudinal direction 11, obliquely in the direction of or away from the housing wall 18. In this case as well, it is possible for all depressions 8 to run obliquely in the same way or to respectively run obliquely toward each other (see FIG. 3). In the case of these obliquely running depressions 8, it is also possible to additionally form the corresponding grooves 22 (see FIG. 2).

The depressions 8 are substantially filled in the transverse direction 24 by the protrusions 9, this likewise being true of the grooves 22 in which the groove protrusions 23 of the protrusions 9 engage. At ends of the depressions 8 in the longitudinal direction 11 (see FIG. 6), there may be play 13 between protrusions 9 and depressions 8 for length compensation at different temperatures (see the above explanations).

Furthermore, there is the possibility that the grooves 22 are not formed directly at the depression bottom 20 (see FIG. 2) but are arranged, for example, at a distance from the depression bottom.

FIGS. 4 and 5 show different distributions of depressions 8 and thus of protrusions 9.

In FIG. 4, the depressions 8 all run in the longitudinal direction 11 or in parallel to the wall longitudinal direction 12. Two depressions 8 along longer edges of the housing part 2 or of the support edge 4 extend substantially over the entire length, while shorter depressions 8 are arranged along the transverse direction 15 which, however, also extend substantially over almost the entire length of support edge or cover edge. A corresponding distance 15 between all depressions 8 can be constant, but the length 14 of the grooves along the shorter parts of the support edge is shorter than the lengths of the other depressions 8.

In FIG. 5, both the distances between and the lengths 14 of all depressions 8 are substantially the same. This also applies to the shape and depth of the corresponding depressions 8.

Further arrangements of the depressions 8 are possible so that, for example, in the case of three rows of depressions 8 according to FIG. 5, depressions of different lengths (for example, one or two depressions analogous to FIG. 4) can also be formed next to each other.

The arrangements of the various depressions 8 apply to all exemplary embodiments of the depressions (see in particular FIGS. 2 and 3).

According to the method according to the invention, these depressions 8 are created directly in the surface of the support edge 4, for example by a laser. In this case, the depressions are created in an appropriate number, length and arrangement as required and as desired by the manufacturer. The cover part or the plastic cover is then placed onto the housing part 2 or heat sink 16, wherein the support edge 4 and the cover edge 6 are in contact with each other. By heating the support edge 4, for example again by the laser, the cover edge partially melts and material of the cover edge flows into the depressions 8 in order to fill them. This results in the protrusions 9, with groove protrusions 23 if necessary (see FIGS. 2 and 3). At the same time, however, it is possible for the depressions not to be filled completely by the respective protrusions 9 in the longitudinal direction 11 at ends of the depressions 8, which provides the corresponding play 13 according to FIG. 6.

FIG. 6 corresponds to a section along the longitudinal direction 11 through the depressions with protrusions according to FIG. 5 and intermediate spaces 25 between adjacent depressions/protrusions.

According to the invention, a connection between a housing part and a cover part in order to create an explosion-proof housing is brought about in a simple, fast and inexpensive manner. The connection is made at a plurality of connection points without using an adhesive. The connection produced has a high stability and a long service life. At the same time, a length compensation between the materials at changing temperatures is made possible by the depressions being incompletely filled by the protrusions.

In particular, an Ex d connection is produced which, depending on requirements, is realized with more or fewer depressions and protrusions in a corresponding arrangement.

The present invention can be used in all cases in which electrical equipment is mounted in or on a metal part and covered by a cover part or a cover.

What is claimed is:
1. An explosion-proof housing comprising:
at least one metal housing part having at least one of a housing opening or receiving surface, and a support edge bordering said at least one of a housing opening or receiving surface;
a cover part covering said at least one of a housing opening or the receiving surface, the cover part comprising a peripheral cover edge which is connected to the support edge in an explosion-proof manner such that in the event of an explosion inside the housing, the explosion is prevented from crossing over to an explosive atmosphere surrounding the housing; and a plurality of connection points formed between the support edge and the cover edge, the connection points including interlocking depressions and protrusions, the protrusions being formed by partial melting of the cover edge;

wherein the depressions and the protrusions interlock with play in a longitudinal direction of the housing.

2. The explosion-proof housing according to claim 1, wherein the depressions and the protrusions extend in parallel to a wall longitudinal direction of the housing.

3. The explosion-proof housing according to claim 1, wherein the depressions and the protrusions are formed at a distance from one another in at least one direction along the support edge or cover edge.

4. The explosion-proof housing according to claim 1, wherein the depressions and the protrusions run obliquely orthogonally to the longitudinal direction.

5. The explosion-proof housing according claim 1, wherein the depressions and the protrusions have grooves or groove protrusions running essentially orthogonally to the longitudinal direction.

6. The explosion-proof housing according to claim 1, wherein the grooves and the groove protrusions are formed substantially orthogonally to the longitudinal direction on both sides in the depressions or on the protrusions.

7. The explosion-proof housing according to claim 1, wherein the depressions and the protrusions are formed at a distance from each other at the edges in the longitudinal direction and orthogonally to the longitudinal direction.

8. The explosion-proof housing according to claim 1, wherein the depressions are each formed in the support edge and the protrusions are each formed in the cover edge.

9. The explosion-proof housing according to claim 1, wherein the depressions and/or protrusions each having the same length are arranged in the longitudinal direction and/or at the same distance.

10. The explosion-proof housing according to claim 1, wherein the depressions and/or protrusion are in each case formed with the same shape.

11. The explosion-proof housing according to claim 1, further comprising at least one light-emitting diode (LED) within the housing part, wherein the cover part is plastic.

* * * * *